(12) United States Patent
Matsumura et al.

(10) Patent No.: US 6,709,606 B2
(45) Date of Patent: Mar. 23, 2004

(54) ANISOTROPIC CONDUCTIVE FILM AND PRODUCTION METHOD THEREOF

(75) Inventors: Akiko Matsumura, Ibaraki (JP); Miho Yamaguchi, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 10/123,180

(22) Filed: Apr. 17, 2002

(65) Prior Publication Data

US 2002/0111055 A1 Aug. 15, 2002

Related U.S. Application Data

(62) Division of application No. 09/572,910, filed on May 17, 2000, now Pat. No. 6,394,821.

(30) Foreign Application Priority Data

May 17, 1999 (JP) ............................................ 11-136358

(51) Int. Cl.[7] .................................................. B44C 1/22
(52) U.S. Cl. ........................................... 216/11; 216/18
(58) Field of Search ................................ 216/18, 75, 11

(56) References Cited

U.S. PATENT DOCUMENTS

| | | |
|---|---|---|
| 3,541,222 A | 11/1970 | Parks et al. |
| 4,008,300 A | 2/1977 | Ponn |
| 4,289,384 A | 9/1981 | Samek |
| 4,548,862 A | 10/1985 | Hartman |
| 4,814,040 A | 3/1989 | Ozawa |
| 5,174,766 A | 12/1992 | Yoshizawa et al. |
| 5,281,771 A | 1/1994 | Swift et al. |
| 5,420,620 A | 5/1995 | Tamura |
| 5,805,424 A | 9/1998 | Purinton |
| 5,896,276 A | 4/1999 | Tamura et al. |

FOREIGN PATENT DOCUMENTS

| | | |
|---|---|---|
| JP | 61-292866 | 12/1986 |
| JP | 8-273725 | 10/1996 |
| JP | 08-335471 | 12/1996 |
| JP | 9-117244 | 2/1998 |

*Primary Examiner*—Cathy Lam
(74) *Attorney, Agent, or Firm*—Sughrue Mion, PLLC

(57) ABSTRACT

An anisotropic conductive film 1 comprising an insulating film 2 and plural conductive paths (3, 4), wherein the plural conductive paths are insulated from each other and penetrate the insulating film 2 in the thickness direction of the film, with both ends of the paths being exposed on both surfaces of the insulating film, and wherein a conductive path 3 capable of contact with an electrode 12 of a semiconductor element 11 and a circuit 14 of a circuit board 13 has at least one end protruding more than an end on the same side of a conductive path incapable of contact with the electrode and the circuit. The ACF of the present invention can prevent a conductive path not involved in electrical connection from being in contact with a part other than an electrode of a semiconductor element and/or a part other than a circuit of a circuit board.

5 Claims, 7 Drawing Sheets

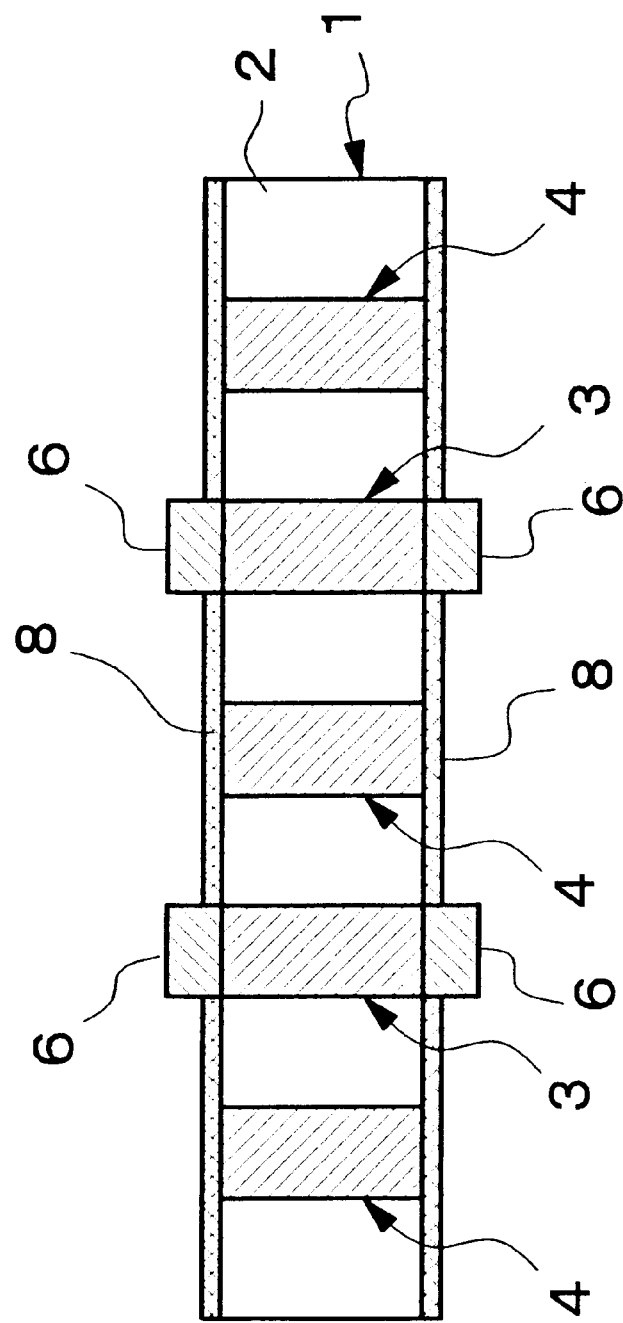

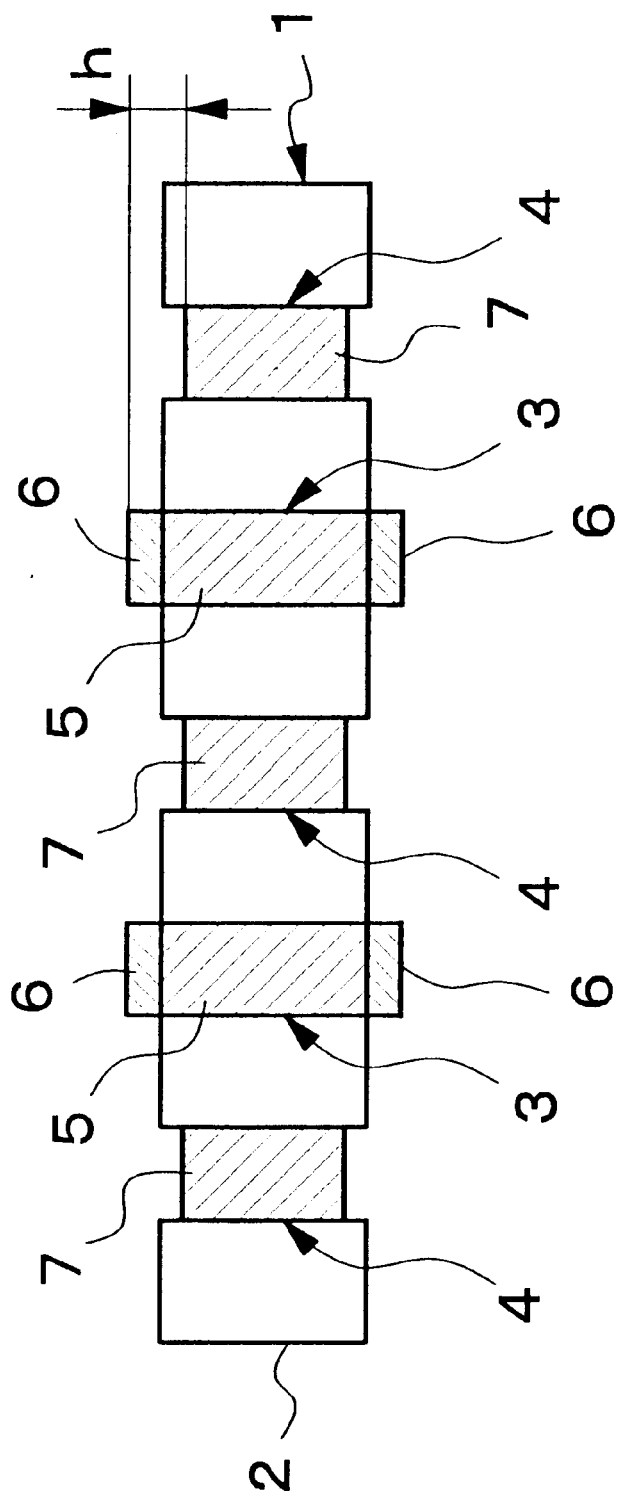

ANISOTROPIC CONDUCTIVE FILM AND PRODUCTION METHOD THEREOF

CROSS-REFERENCE TO RELATED APPLICATIONS

This is a divisional application based on U.S. patent application Ser. No. 09/572,910, filed May 17, 2000 now U.S. Pat. No. 6,394,821, the entire contents of which are incorporated herein by reference.

TECHNICAL FIELD OF THE INVENTION

The present invention relates to an anisotropic conductive film to be interposed between a semiconductor element and a circuit board to form an electrical connection between them, and to a production method thereof.

BACKGROUND OF THE INVENTION

An anisotropic conductive film (hereinafter to be also referred to as ACF) can establish electrical connection merely by insertion thereof between a semiconductor element and a circuit board and application of a pressure. The simple and easy handling that is available with ACF has produced a growing demand in recent years on its use in high precision semiconductor elements. A typical ACF is obtained by dispersing conductive particles in a film made from an adhesive insulating material.

However, the conventional ACF is associated with a difficulty in achieving fine pitch connection and a need to use a convex terminal (e.g., bump contact) as a connection terminal of a semiconductor element.

To solve these problems, Japanese Patent Application No. 9-117244 (WO 98/07216) proposes an ACF prepared by penetrating plural conductive paths in the thickness direction of an insulating film.

In the proposed ACF, an electrical connection has been established between a semiconductor element and a circuit board with the aid of a conductive path capable of making contact with both an electrode of the semiconductor element and a circuit of the circuit board.

The conductive paths incapable of making contact with an electrode of a semiconductor element and a circuit of a circuit board do not contribute to the electrical connection. The both ends of these conductive paths make contact with the semiconductor element at some place else but the electrode and with the circuit board at some place else but the circuit, only when a pressure is applied.

When, however, an end on the semiconductor element side touches a part other than an electrode of the semiconductor element, a passivation layer formed on the semiconductor element may be broken depending on the shape of the semiconductor element, and a fine circuit wiring on the semiconductor element may be deformed, causing damage on the semiconductor element. Damaged semiconductor elements tend to suffer from a short failure or open failure.

When the end on the side of the circuit board is under contact with a circuit board at a part other than a circuit, the circuit may have lower connection reliability. Such lower connection reliability is highly likely to occur particularly when a resist formed on the circuit board is thicker than the circuit itself.

It is therefore an object of the present invention to solve the above-mentioned problems and provide an anisotropic conductive film free of contact between a conductive path irrelevant to the electrical connection, and a semiconductor element at a part other than an electrode and/or a circuit board at a part other than a circuit, as well as a production method thereof.

SUMMARY OF THE INVENTION

The ACF of the present invention is interposed between a semiconductor element and a circuit board to make an electrical connection and is characterized by the following embodiments.

(Embodiment 1) Plural conductive paths insulated from each other penetrate an insulating film in the thickness direction of the film, with the both ends of the paths being exposed on the surface of the insulating film, wherein a conductive path capable of touching an electrode of a semiconductor element has an end on the semiconductor element side protruding more than an end on the semiconductor element side of a conductive path incapable of contact with the electrode.

(Embodiment 2) Plural conductive paths insulated from each other penetrate an insulating film in the thickness direction of the film, with the both ends of the paths being exposed on the surface of the insulating film, wherein a conductive path capable of touching a circuit of a circuit board has an end on the circuit board side protruding more than an end on the circuit board side of a conductive path incapable of contact with the circuit.

(Embodiment 3) Plural conductive paths insulated from each other penetrate an insulating film in the thickness direction of the film, with the both ends of the paths being exposed on the surface of the insulating film, wherein a conductive path capable of touching an electrode of a semiconductor element and a circuit of a circuit board has both ends protruding more than both ends of a conductive path incapable of contact with the electrode and the circuit.

According to the present invention, a conductive path in ACF, which is capable of contact with the electrode of a semiconductor element and/or the circuit of a circuit board, can protrude from the insulating film.

A conductive path in ACF of the present invention, which is incapable of contact with the electrode of a semiconductor element and/or the circuit of a circuit board, may be recessed from the surface of the insulating film. This conductive path may have an insulating layer formed on an end thereof.

The Embodiment 1 of the ACF of the present invention can be produced by the following steps.

(a) Forming plural conductive rods in an insulating film in such a manner that the rods are insulated from each other and penetrate the film in the thickness direction thereof.

(b) Extending, of the plural rods, a rod capable of contact with an electrode of a semiconductor element and/or shortening a rod incapable of such contact, so that the rod capable of contact with the electrode has an end on the semiconductor element side protruding more than an end on the semiconductor element side of the rod incapable of contact.

The Embodiment 2 of the ACF of the present invention can be produced by the following steps.

(a) Forming plural conductive rods in an insulating film in such a manner that the rods are insulated from each other and penetrate the film in the thickness direction thereof.

(b) Extending, of the plural rods, a rod capable of contact with a circuit of a circuit board and/or shortening a rod incapable of such contact, so that the rod capable of contact has an end on the circuit board side protruding more than an end on the circuit board side of the rod incapable of contact.

The Embodiment 3 of the ACF of the present invention can be produced by the following steps.

(a) Forming plural conductive rods in an insulating film in such a manner that the rods are insulated from each other and penetrate the film in the thickness direction thereof.

(b) Extending, of the plural rods, a rod capable of contact with an electrode of a semiconductor element and a circuit of a circuit board and/or shortening a rod incapable of such contact, so that the rod capable of contact has both ends protruding more than both ends of the rod incapable of contact.

According to the production method of the present invention, one or both ends of a rod capable of contact may be extended by deposit of a conductive material thereon.

According to the production method of the present invention, moreover, one or both ends of a rod incapable of contact may be shortened by etching.

In these Figures, 1 is ACF, 2 is an insulating film, 3 is a conductive path, 4 is a conductive path, 11 is a semiconductor element, 12 is an electrode of the semiconductor element, 13 is a circuit board and 14 is a circuit.

DETAILED DESCRIPTION OF THE INVENTION

The present invention is explained in detail in the following by referring to the Figures.

Figure 1:
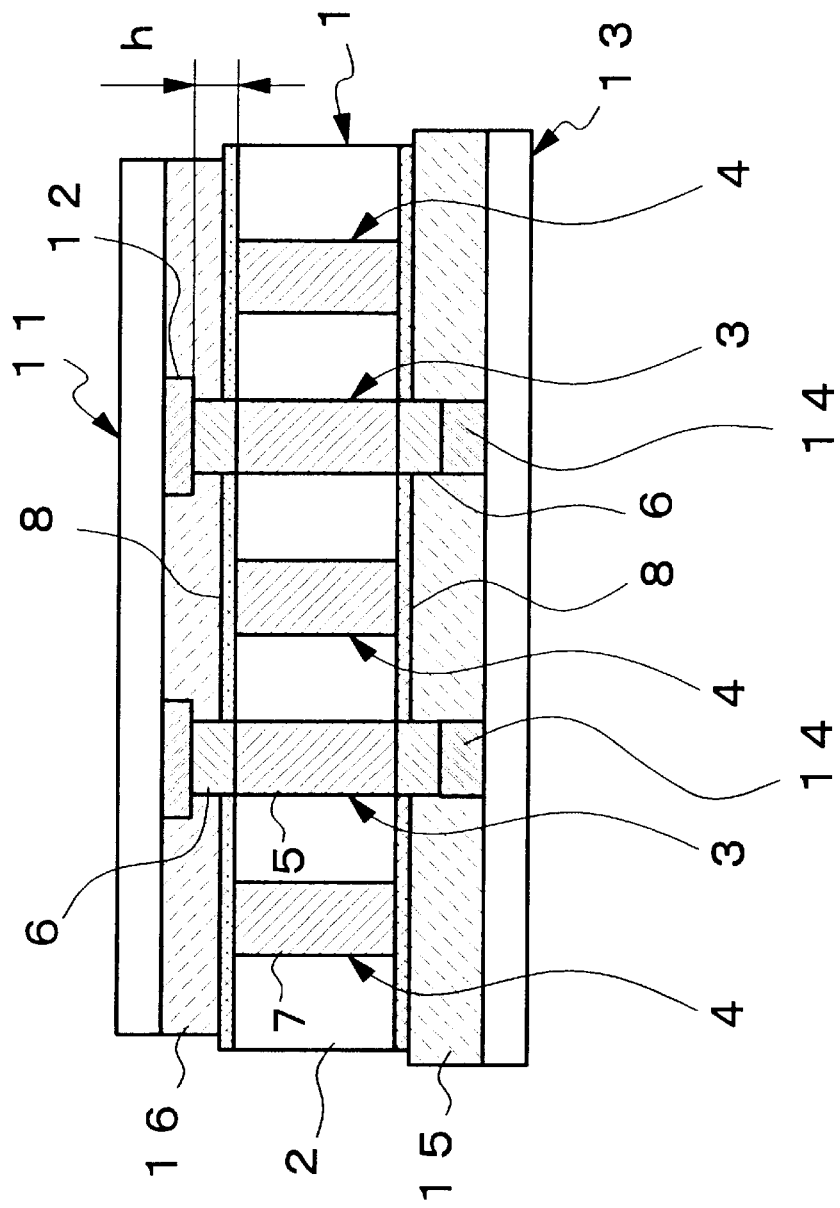
FIG. 1 shows one embodiment of the inventive ACF.

FIG. 1 shows a cross section of one embodiment of the ACF of the present invention. In FIG. 1, a semiconductor element 11 and a circuit board 13 to be connected in the present invention are also shown. ACF 1 is connected to the semiconductor element 11 and the circuit board 13.

As shown in FIG. 1, ACF 1 is interposed between the semiconductor element 11 and the circuit board 13 to establish an electrical connection. In ACF 1, plural conductive paths (3, 4) are arranged in such a manner that they are insulated from each other, penetrate the film in the thickness direction, and are exposed on the both sides of the insulating film 2.

As shown in the embodiment of FIG. 1, of the plural conductive paths (3, 4), the both ends of the conductive path 3 located at a contact position with the electrode 12 of the semiconductor element 11 and the circuit 14 of the circuit board 13 protrude more than the ends of the conductive path 4 incapable of contact with the electrode 12 of the semiconductor element 11 or the circuit 14 of the circuit board 13.

In the embodiment of FIG. 1, the conductive path 3 comprises, of the conductive rods (5, 7) penetrating the insulating film 2, the rod 5 at the contact position with the electrode 12 of the semiconductor element 11 and the circuit 14 of the circuit board 13, which has conductive terminals 6 formed on both ends of the rod 5 to extend the rod. The both ends of the conductive path 3 protrude more than the both ends of the conductive path 4. The conductive terminal 6 formed on the semiconductor element side is in contact with the electrode 12 of the semiconductor element 11, and the conductive terminal 6 formed on the circuit board side is in contact with the circuit 14 of the circuit board 13. 16 shows passivation formed on the semiconductor element 11 and 15 is a resist formed on the circuit board 13.

In the embodiment of FIG. 1, an insulating layer 8 covering the area other than conductive path 3 is formed on the both surfaces of the insulating film 2 to block the both ends of the conductive paths 4. This insulating layer 8 enhances the adhesion to the passivation 16 and resist 15, which in turn improves the connection reliability.

As shown in the embodiment of FIG. 1, when ACF 1 of the present invention is used, the conductive paths 3 alone, which are at the contact position with the electrode 12 of the semiconductor element 11 and the circuit 14 of the circuit board 13, can be brought into contact with the semiconductor element 11 and circuit board 13. The conductive paths 4 are kept from being in contact with the semiconductor element 11 and circuit board 13. This has a consequence that the semiconductor element 11 and circuit board 13 are free from damage due to the contact of paths 4.

In the present invention, at least one end of the conductive path 3 protrudes more than the end on the same side of conductive path 4, which embodiment is not limited to the embodiment shown in FIG. 1. The following embodiments are also encompassed in the present invention.

(1) A conductive path at the contact position with an electrode of a semiconductor element has an end, on the semiconductor element side, which protrudes more than the end on the same side of a conductive path incapable of contact with the electrode of the semiconductor element.

(2) A conductive path at the contact position with a circuit of a circuit board has an end, on the circuit board side, which protrudes more than the end on the same side of a conductive path incapable of contact with the circuit of the circuit board.

To be specific, only the end on the semiconductor element side of the conductive path 3 protrudes more than the end on the same side of the conductive path 4. The ends on the circuit board side of the conductive path 3 and the conductive path 4 are at the same distance from the film surface, as in a conventional film. A reverse mode can be also employed.

Figure 2:
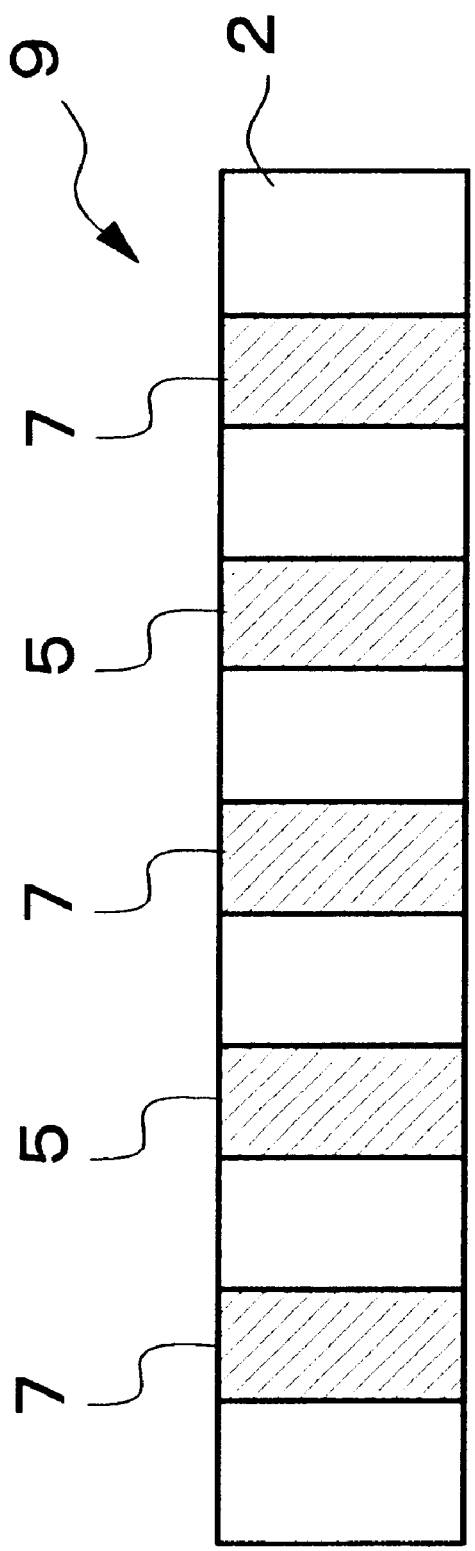
FIGS. 2(a), 2(b) and 2(c) show one embodiment of the production method of the ACF of the present invention.
Figure 2:
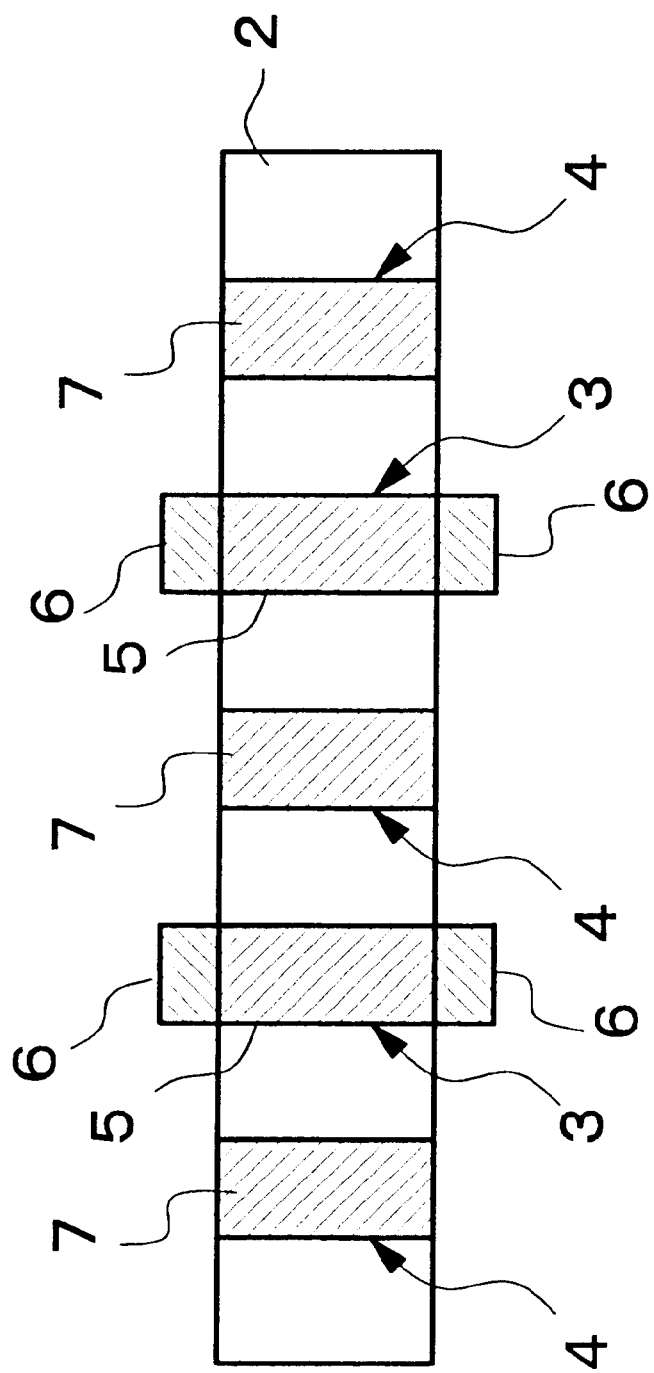

The production method of the inventive ACF is explained in the following. FIG. 2 shows a cross sectional view of one example of the production method of the ACF of the present invention. In FIG. 2, ACF 1 shown in FIG. 1 is produced.

As shown in FIG. 2(a), the insulating film 2 contains plural conductive rods (5, 7) insulated from each other and penetrating the film in the thickness direction to form a structure 9. The ends of the plural conductive rods (5, 7) are exposed on the both surfaces of the insulating film 2. Rod 5 and rod 7 are preferably formed from the same material and preferably have the same length and the same diameter. In this embodiment, rod 5 and rod 7 are made from the same material and have the same length and the same diameter. The structure 9 is that of the conventional ACF.

The conductive rods (5, 7) constitute the conductive paths (3, 4). As explained below, rod 5 is extended and/or rod 7 is shortened to form conductive paths (3, 4). The material of the rods (5, 7) is preferably metallic. Note that the same metallic material may show different conductivity depending on how the rods are formed. The rods (5, 7) may be formed by plating through-holes formed in the insulating film 2 with a metallic material. However, in the most preferable embodiment in the present invention, the following metal conductor wires are passed through the insulating film 2 to give rods (5, 7). Of the metal conductor wires, for example, a metal conductor wire produced to conduct electricity, such as a copper wire defined in JIS C 3103, is preferable. Such wire can make a conductive path most superior in electrical property, mechanical property and an economic aspect.

The structure 9 wherein a number of metal conductor wires penetrate the insulating film 2 can be obtained by fixing a number of insulated wires bundled densely in an inseparable manner and slicing the wire bundle in a desired film thickness in the direction forming an angle with the insulated wires. The ACF of the present invention is most desirably prepared according to a production process including the following steps (1) to (3).

(1) Forming one or more covering layers made from an insulating resin on a metal conductor wire (diameter 5–100 $\mu$m) to give an insulated conductor wire, and winding the wire around a core.

(2) Heating and/or pressing the coil resulting from (1) to integrally weld and/or compression-bond the covering layers of the insulated conductor wire to give a coil block.

(3) Slicing the coil block in a desired thickness in the direction of a plane crossing the insulated wires at an angle to give a film.

The above-mentioned steps (1) to (3) enable the most efficient dense bundling of the insulated wires and easily produce the closest packed collective pattern of the conductive paths.

According to this production method, it is also possible to form plural covering layers on the surface of a metal conductor wire according to a desired use, such as for insulation, adhesion and the like. The ACF thus obtained can show variation in electrical properties and mechanical properties, such as conductivity, dielectric property, insulating property, adhesiveness, strength and the like, in the direction of expansion of the film plane. When the structure 9 is prepared according to the method mentioned above, ACF 1 of the present invention can have high reliability sufficient for the electrical connection at narrower pitch, which in turn leads to a lower cost of ACF 1 of the present invention. It also facilitates production of ACF 1 having a thickness of not less than 20 $\mu$m.

In the foregoing production method, the metal conductor wire to be used in (1) has an outer diameter of 5 $\mu$m–100 $\mu$m, in view of the preferable outer diameter of the conductive path to be mentioned later. The insulating resin to be applied to the surface thereof to form a covering layer is the material of the insulating film to be mentioned later. In step (2), when the wire is wound in the closest winding, the conductive paths (3, 4) can be arranged regularly. The closest winding means that the wire is tightly wound at a relatively low speed at a feed out pitch of about the outer diameter of the wire, such that the layered wires collectively form a nearly closest packed state. The angle of slicing can be optionally set in step (3) to alter the angle of conductive paths (3, 4). Reference may be made to WO98/07216 entitled "Anisotropic conductive film and process thereof" for the above-mentioned production process.

As shown in the embodiment of FIG. 2(b), of the plural rods (5, 7), the rod 5 is extended to form a conductive path 3. As a result, the both ends of rod 5 at the contact position with the electrode of a semiconductor element (not shown) and the circuit of a circuit board (not shown) become taller than the both ends of the rod 7 incapable of such contact.

In the embodiment of FIG. 2(b), a conductive material is selectively deposited only on the both ends of rod 5, that is to be protruded from the insulating film surface, by electroless plating or electrolytic plating, thereby forming a conductive terminal 6 to extend the rod 5. As shown in the embodiment of FIG. 3 below, rod 7 may be shortened instead, to ultimately make at least one end of rod 5 taller than the end on the same side of rod 7. Even when rod 7 is shortened, the end of rod 5 is preferably extended by forming a conductive terminal 6.

The production method of the present invention encompasses the following modes according to the desired embodiment of ACF.

(1) The rod at the contact position with the electrode of a semiconductor element is extended, such that only an end on the semiconductor element side of this rod becomes taller than the end on the same side of a rod incapable of such contact.

(2) The rod at the contact position with the circuit of a circuit board is extended, such that only an end on the circuit board side of this rod becomes taller than the end on the same side of a rod incapable of such contact.

In (1), (2), moreover, the rod at the contact position may not be extended but the rod incapable of contact may be shortened, or the rod in the contact position may be extended and the other rod may be shortened.

Finally, as shown in the embodiment of FIG. 2(c), an insulating layer 8 is formed on both surfaces of an insulating film except conductive paths 3, to block the both ends of the conductive paths 4, whereby ACF 1 of the present invention is completed. The insulating layer 8 can be formed by adhering a sheet or film to the both surfaces of the insulating film 2.

In the present invention, the conductive path can be formed from a known conductive material. Preferred in terms of electrical property are metallic materials such as copper, gold, aluminum, nickel and the like. From the aspect of conductivity, copper and gold are more preferable. The material forming the conductive terminal 6 can be a metallic material having high conductivity, or nickel, gold, solder and the like, that are superior in corrosion resistance. The material to form a conductive terminal and the material to form other parts (rod 5 in FIGS. 1, 2) may be the same or different.

In the present invention, the conductive path that comes into contact with the electrode of a semiconductor element and/or the circuit of a circuit board has at least one end thereof protruding from the end on the same side of other conductive paths incapable of contact with the electrode and/or circuit, as shown in FIGS. 1, 2. The height (h in FIG. 1 and FIG. 3) of the protrusion is 0.5 $\mu$m –40 $\mu$m, preferably 2 $\mu$m –30 $\mu$m. This range of height enables inhibition of damage on the semiconductor element and ensures electrical connection, as well as improved connection reliability with the circuit board.

The above-mentioned protruding end of the path capable of contact preferably protrudes outwardly from the surface of an insulating film, as shown in FIG. 1. This provides an effect of ensured electrical connection between the semiconductor element and the circuit board. The end on the semiconductor element side and/or circuit board side of the path incapable of contact preferably makes a recess from the surface of the insulating film. In this case, the semiconductor element and the circuit board are completely free from damage and the connection reliability with the circuit board can be enhanced.

The conductive path is free of any particular limitation in size and shape. It can have various sizes and shapes suitable for the mating semiconductor element and circuit board.

When dealing with a fine-pitched setting of electrode (e.g., pitch not more than 50 μm), the path preferably has an outer diameter of 5 μm –30 μm. The shape of the section of the conductive path may be any such as circular or polygonal, as long as the above conditions are met. One electrode of a semiconductor element is preferably in contact with plural conductive paths of up to about 10.

The conductive paths are preferably arranged densely in a film substrate. The arrangement pattern of the conductive paths, when seen from the film surface, is a square matrix, closest packed state or may be in a randomly dense state, with preference given to the closest packed state for connection with an electrode of a fine semiconductor element.

The material used for forming an insulating film in the present invention may be a conventional insulating material for ACF. However, an adhesive insulating material is preferable for prevention of drop off of a conductive path and for highly reliable connection between semiconductor element and circuit board. Examples of the adhesive insulating material include thermosetting resins such as phenol type epoxy resin, biphenyl type epoxy resin, polyester resin, acrylic resin, polycarbodiimide resin etc., thermoplastic resins such as phenoxy resin, polyamide resin (e.g., nylon 6, nylon 6,6), PET saturated polyester resin, PBT saturated polyester resin, polyimide resin (e.g., polyamideimide resin) etc., and a resin obtained by mixing two or more kinds from these. Of these, polycarbodiimide resin and polyimide resin are preferable in view of heat resistance and low hygroscopicity.

The insulating film has a thickness of 10 μm–200 μm, preferably 20 m–100 μm. When the thickness is less than 10 μm, an anisotropic conductive film tends to have lower adhesive power. When it exceeds 200 μm, contact resistance increases to sometimes impair electrical reliability of the inventive ACF.

The insulating layer to cover an end of a conductive path incapable of contact with the electrode of a semiconductor element and/or the circuit of a circuit board is formed from an insulating material. For higher connection reliability between the semiconductor element and circuit board, an adhesive insulating material is used. The material to form the insulating layer is selected from the above-mentioned materials exemplified for the insulating film. The insulating layer and the insulating film may be formed from the same material or different materials.

FIG. 3 is a cross sectional view showing another embodiment of the ACF of the present invention and the production method thereof. In FIG. 3(c) drawn with the lines expressing the cross section, a semiconductor element 11 and a circuit board 13 to be connected are also shown in addition to ACF 1 of the present invention.

Figure 3A:
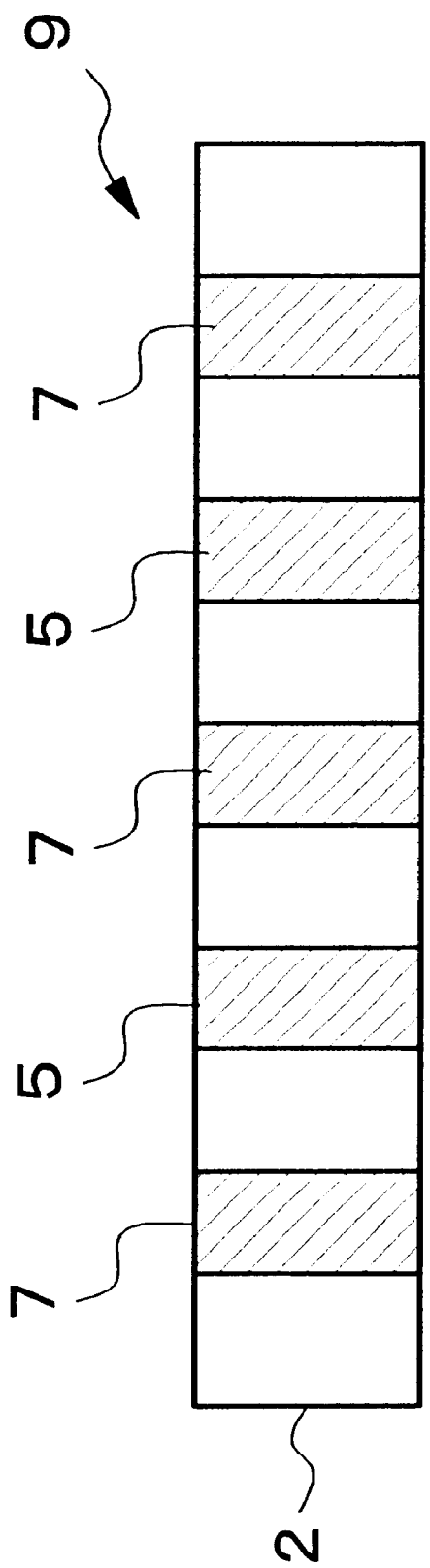
FIGS. 3(a), 3(b) and 3(c) show another embodiment of the ACE and the production method thereof according to the present invention.
Figure 3:
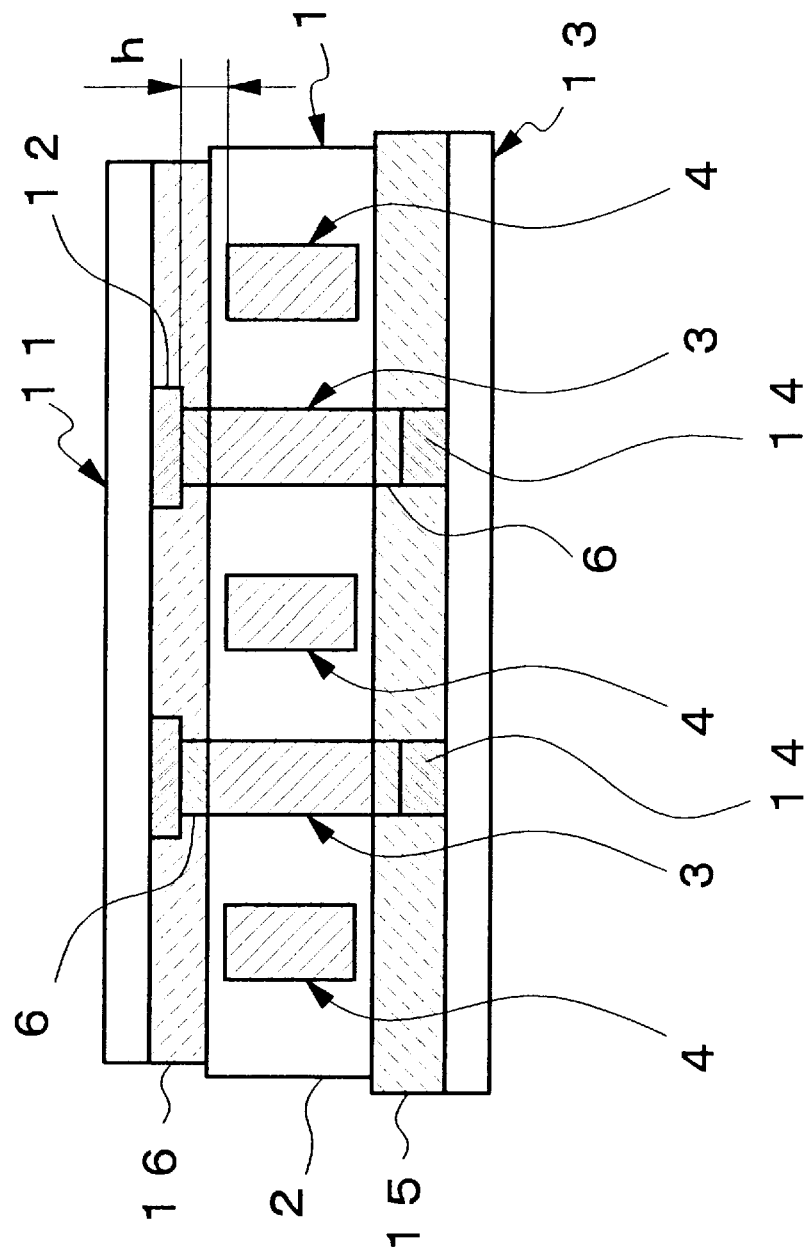

In the embodiment of FIG. 3(a), like FIG. 2(a), plural conductive rods (5, 7) are arranged in an insulating film 2 in such a manner that they are insulated from each other and penetrate the film in the thickness direction, thereby forming a structure 9. In FIG. 3(b), like FIG. 2(b), rod 5 at the contact position with the electrode 12 of the semiconductor element 11 and the circuit 14 of the circuit board 13 has a conductive terminal 6 formed on the both ends. In this way, conductive paths 3 with both ends protruding from the conductive paths 4 are obtained. The ends of the conductive path 3 protrude from the surface of the insulating film 2.

In the embodiment of FIG. 3(b), however, rods 7 incapable of contact with the electrode 12 of the semiconductor element 11 and the circuit 14 of the circuit board 13 have been shortened to form conductive paths 4. The conductive paths 4 have both ends recessed from the surface of the insulating film 2. The rods 7 can be shortened by etching one or both ends of rods 7. In the embodiment of FIG. 3(b), the both ends of rods 7 have been etched. The etching may be chemical etching with an acid or alkali, and may be anisotropic etching or isotropic etching.

In the embodiment of FIG. 3(c), ACF 1 prepared by the steps shown in FIGS. 3(a), (b) is joined with the semiconductor element 11 and circuit board 13. In FIG. 3(c), 16 is a passivation applied onto the semiconductor element 11, 15 is a resist formed on the circuit board 13. In this case, the insulating film 2 is formed from a material that shows fluidity when forming a junction. It flows to fill the gaps between conductive path 4 and passivation 16 or resist 15. As a result, a solid junction can be made between ACF 1 and the semiconductor element 11 or circuit board 13.

EXAMPLE 1

Preparation of ACF

ACF as shown in FIG. 1 was prepared according to the production steps shown in FIG. 2. First, a structure 9 was prepared, which comprised an insulating film 2 (thickness 70 μm) made from polycarbodiimide resin and copper rods (5, 7) having a diameter of 18 μm and a length of 70 μm, penetrating in the thickness direction, as shown in FIG. 2(a). As shown in FIG. 2(b), the both ends of rods 5 at the contact position with the electrode of a semiconductor element and the circuit of a circuit board were subjected to electroless Ni/Au plating to form conductive paths 3 having conductive terminals 6 protruding by 10 μm from the surface of the insulating film 2. Then, as shown in FIG. 2(c), a 5 μm thick insulating layer 8 made from polycarbodiimide was formed on the both surfaces of the insulating film 2 except the conductive paths 3 to give ACF 1 of the present invention.

Junction Between Semiconductor Element and Circuit Board

ACF 1 obtained above was connected to a semiconductor element 11 (10 mm×10 mm, number of electrodes 152) and a circuit board 13 (glass epoxy substrate FR-4), as shown in FIG. 1. The junction was made using a flip chip bonder under the conditions of temperature at tool part 250° C., temperature at stage 150° C., pressure 0.98 MPa by pressurizing and heating for 40 seconds. The obtained semiconductor device was subjected to a continuity test. As a result, continuity was confirmed in all of the 152 electrodes with no occurrence of short failure. It is concluded therefrom that the semiconductor element was free of damage, and the connection reliability with the circuit board was intact.

EXAMPLE 2

Preparation of ACF

ACF was prepared according to the production steps shown in FIGS. 3(a), (b). First, as shown in FIG. 3(a), a structure 9 was prepared, which was the same as the one prepared in Example 1. Then, as shown in FIG. 3(b), the both ends of rods 7 incapable of contact with the electrode of a semiconductor element and the circuit of a circuit board were subjected to alkali etching to make 5 μm recesses on the surface of the insulating film 2, whereby a conductive paths 4 were formed. In the same manner as in Example 1, conductive terminals 6 were formed on the both ends of rods 5 to give conductive paths 3.

Junction Between Semiconductor Element and Circuit Board

ACF obtained above was prepared into a semiconductor device by forming a junction and subjected to a continuity test in the same manner as in Example 1. As a result, continuity was confirmed in all of the 152 electrodes with no occurrence of short failure. It is concluded therefrom that the semiconductor element was free of damage, and the connection reliability with the circuit board was intact.

Comparative Example 1

In the same manner as in Example 1, a structure was prepared. The both ends of all the rods were subjected to electroless Ni/Au plating to form conductive terminals 6 outwardly protruding by 2 μm from the surface of the insulating film 2, whereby ACF was prepared. The ACF was prepared into a semiconductor device by forming a junction and subjected to a continuity test in the same manner as in Example 1. As a result, continuity was confirmed in 106 electrodes out of 152 electrodes (79% of the total electrodes), with occurrence of short failure. It is concluded therefrom that the semiconductor element was damaged, and the connection reliability with the circuit board was degraded.

As explained in the above, the ACF of the present invention can prevent one or both ends of the conductive path not involved in electrical connection from touching a part other than an electrode of a semiconductor element and/or a part other than a circuit of a circuit board, when a pressure is applied. In other words, the use of the ACF of the present invention prevents damage on a semiconductor element and degradation of connection reliability with a circuit board. The production method of the present invention facilitates production of the inventive ACF.

This application is based on a patent application No. 136358/1999 filed in Japan, the contents of which are hereby incorporated by reference.

What is claimed is:

1. A production method of an anisotropic conductive film comprising an insulating film and plural conductive paths, to be interposed between a semiconductor element and a circuit board to establish an electrical connection between them, wherein the plural conductive paths are insulated from each other and penetrate the insulating film in the thickness direction of the film, with both ends of the paths being exposed on the surface of the insulating film, and wherein a conductive path capable of contact with an electrode of the semiconductor element has an end on the semiconductor element side protruding more than an end on the semiconductor element side of a conductive path incapable of contact with the electrode, which comprises at least the steps of (a) forming plural conductive rods in an insulating film in such a manner that the rods are insulated from each other and penetrate the film in the thickness direction thereof, and (b) extending a rod capable of contact with an electrode of the semiconductor element, or shortening a rod incapable of contact with the electrode, or extending a rod capable of contact with the electrode and shortening a rod incapable of contact with the electrode, so that the rod capable of contact has an end on the semiconductor element side protruding more than an end on the semiconductor element side of the rod incapable of contact.

2. A production method of an anisotropic conductive film comprising an insulating film and plural conductive paths, to be interposed between a semiconductor element and a circuit board to establish an electrical connection between them, wherein the plural conductive paths are insulated from each other and penetrate the insulating film in the thickness direction of the film, with both ends of the paths being exposed on the surface of the insulating film, and wherein a conductive path capable of contact with a circuit of the circuit board has an end on the circuit board side protruding more than an end on the circuit board side of a conductive path incapable of contact with the circuit, which comprises at least the steps of, (a) forming plural conductive rods in an insulating film in such a manner that the rods are insulated from each other and penetrate the film in the thickness direction thereof, and (b) extending a rod capable of contact with a circuit of a circuit board, or shortening the rod incapable of contact with the circuit, or extending a rod capable of contact with the circuit and shortening a rod incapable of contact with the circuit, so that the rod capable of contact has an end on the circuit board side protruding more than an end on the circuit board side of the rod incapable of contact.

3. A production method of an anisotropic conductive film comprising an insulating film and plural conductive paths, to be interposed between a semiconductor element and a circuit board to establish an electrical connection between them, wherein the plural conductive paths are insulated from each other and penetrate the insulating film in the thickness direction of the film, with both ends of the paths being exposed on the surface of the insulating film, and wherein a conductive path capable of contact with an electrode of the semiconductor element and a circuit of the circuit board has both ends protruding more than both ends of a conductive path incapable of contact with the electrode and the circuit, which comprises at least the steps of (a) forming plural conductive rods in an insulating film in such a manner that the rods are insulated from each other and penetrate the film in the thickness direction thereof, and (b) extending a rod capable of contact with an electrode of the semiconductor element and a circuit of the circuit board, or shortening a rod incapable of contact with the electrode and the circuit, or extending a rod capable of contact with the electrode and the circuit and shortening a rod incapable of contact with the electrode and the circuit, so that the rod capable of contact has both ends protruding more than both ends of the rod incapable of contact.

4. A production method of the anisotropic conductive film of any of claims 1 to 3, further comprising depositing a conductive material on one or both ends of the rod at the contact position to extend the rod.

5. A production method of the anisotropic conductive film of any of claims 1 to 3, further comprising etching one or both ends of the rod at the non-contact position to shorten the rod.

* * * * *